Aug. 7, 1962 L. W. BERNI 3,048,805

PLUG-IN POTENTIOMETERS

Filed Oct. 4, 1960

INVENTOR

Louis W. Berni,

BY Paris, Haskell & Levine

ATTORNEYS

United States Patent Office 3,048,805
Patented Aug. 7, 1962

3,048,805
PLUG-IN POTENTIOMETERS

Louis W. Berni, East Boston, Mass., assignor to Ace Electronics Associates, Inc., a corporation of Massachusetts Filed Oct. 4, 1960, Ser. No. 60,406
3 Claims. (Cl. 338—221)

The present invention relates to plug-in potentiometers, and more particularly to an adapter for rendering a conventional solder terminal potentiometer a plug-in-unit.

Potentiometers and rheostats are conventionally fabricated with an enclosure or housing, and the exterior of the housing usually carries a plurality of terminals connected internally of the housing with the resistance element at appropriate points, and with a variable tap element arranged to traverse the resistance element for deriving varying resistance values from the resistance element. A control shaft, or the like, is also normally provided projecting from the housing, mechanically linked to the variable tap element for variably controlling the position of the tap element relative to the resistance element.

Normally, the aforementioned terminals are designed for direct connection to wire leads, and for this purpose they are conventionally in the form of solder lugs, binding posts, or the like. However, with the development of miniature and subminiature electrical systems, and particularly with the evolvement of complex electronic circuit systems utilizing extensive numbers of components arrayed on panel boards and printed circuit panels, a need has developed for components that can be readily inserted, removed, and replaced in the circuit system with facility and with a minimum danger of upsetting the wiring of the system.

Accordingly, plug-in components have been developed, which can be readily inserted and removed from appropriate sockets in the circuit system panel boards and which operations do not in any way require manipulation of the wiring or electrical connections to the sockets. The plug-in units are fabricated with external connector pins designed and located to enter the pin receptacle in the sockets, and these pins are electrically connected internally of the component housing with the elements thereof, thereby becoming the external terminals for the component.

The need for components having solder lug or binding post terminals still remains, however, so that the advent of the new demand for plug-in components tends to increase the stocking requirements of manufacturers, and in some instances requires duplication of product lines, or substantial portions of product lines, with the same line of components being stocked both with solder lug terminals and with plug-in terminals.

In accordance with the present invention, an adapter is provided for readily converting a solder lug terminal potentiometer or rheostat into a plug-in unit, so that duplication of stocking of the components may be avoided. Basically, the present invention contemplates an adapter shell designed to be externally mounted over the housing or casing of the complete solder lug terminal component. The shell is also designed to mount a plug pin base element carrying the requisite plug pins in proper orientation to mate with the receptacles of a corresponding socket. Thus, after the solder lugs are solder-connected to the internal ends of the appropriate plug pins, the shell is fitted over the housing of the component and the base element, thereby adapting the pin base to the component in an integral structure. To protect the connections between the pins and the solder lugs, the volume between the component housing and the pin base housed by the adapter shell is filled with a potting resin compound, thereby lending rigidity and solidity to the assembled structure. Thus, the component manufacturer need stock merely a single line of solder lug terminal components, and these solder lug terminal components may be readily converted to plug-in units as required.

Accordingly, it is one object of the present invention to provide a plug-in adapter for solder lug terminal components.

Another object of the present invention is to provide a plug-in adapter for solder lug terminal components which is applied over the housing of the component without requiring any alteration or modification in design of the component or its housing.

Other objects and advantages of the present invention will become apparent to those skilled in the art from a consideration of the following detailed description of one exemplary specific embodiment of the invention, had in conjunction with the accompanying drawings, in which like numerals refer to like or corresponding parts, and wherein.

Figures 1, 2, 3:
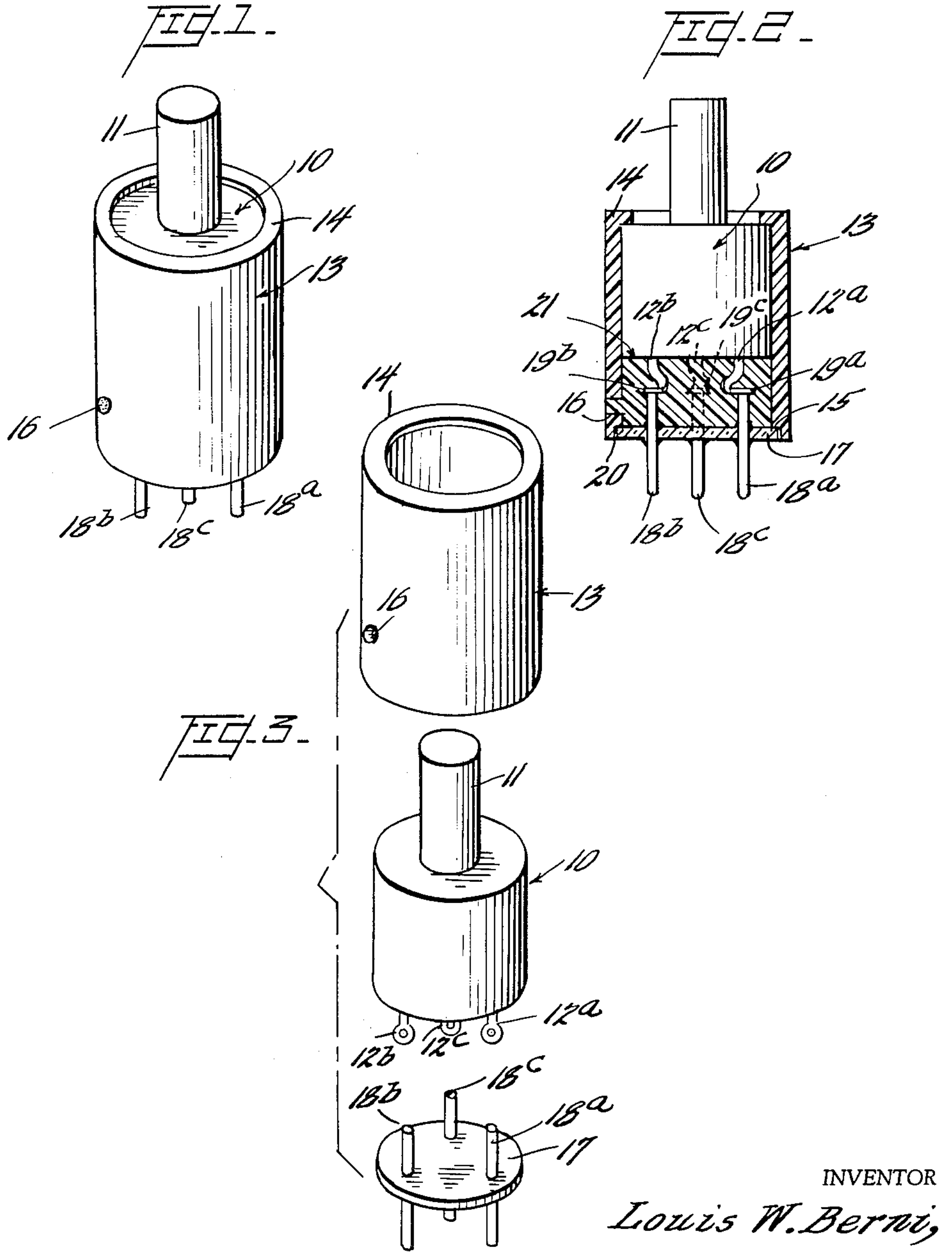
FIG. 1 is a perspective view of a solder lug terminal rotary potentiometer and a plug-in adapter applied thereto in accordance with the present invention.
FIG. 2 is a vertical section through the unit of FIG. 1.
FIG. 3 is an exploded view of the unit of FIG. 1, showing, in perspective, the several component parts thereof.

Referring to the drawings, the numeral 10 generally designates the cylindrical casing of a conventional rotary potentiometer, having solder lug terminals 12*a*, 12*b*, and 12*c*, and control shaft 11 protruding therefrom. Since rotary potentiometers are well known in the art, the mechanism internal of casing 10 is not shown. However, as will be understood by those skilled in the art, it includes an elongated resistance element supported circumferentially around the interior of casing 10, and a wiper contact supported by shaft 11, so that on rotation of shaft 11 the wiper contact traverses the length of the resistance element. Each end of the resistance element is electrically connected to a respective solder lug terminal 12, and the wiper contact is electrically connected to the remaining solder lug terminal 12. Thus, by applying a voltage across the entire resistance element by connecting a voltage source to the two solder terminals connected to the ends of the resistance element, a desired fraction of that voltage can be tapped from the third solder lug terminal by appropriately locating the wiper contact along the resistance element.

In order to conveniently and economically convert this solder lug terminal potentiometer to a plug-in unit, a pin contact base, such as those used in the manufacture of glass vacuum tubes, is employed, and is indicated by the numeral 17. It comprises a disc of glass, or other electrical insulation material, into which a plurality of electrically conducting metal pins 18 are sealed, with each pin 18 projecting to either side of the disc. The corresponding ends of the pins 18*a*, 18*b*, and 18*c* are soldered to respective solder lug terminals 12*a*, 12*b*, and 12*c*, at 19*a*, 19*b*, and 19*c*, thus providing a plug-in base for the potentiometer 10.

To unitize this assembly, a cylindrical sleeve 13 is applied over the potentiometer 10 and base element 17. The sleeve 13 is preferably formed of a rigid material, such as a phenolic resin, and may be molded or machined to fit telescopically over the casing 10 of the potentiometer. The upper end of the sleeve 13 is formed with an inwardly projecting circumferential flange 14, adapted to abut the top surface of the potentiometer casing 10. The bottom end of the sleeve 13 is formed with an internal circumferential recessed shoulder 15, adapted to receive and seat the pin contact base 17. The base 17 is permanently secured in this seat 15 by means of a suitable cement, or other sealing compound such as an epoxy resin. To further rigidify the connection of the base 17 to the potentiometer 10, and to protect the solder joints at 19, an epoxy potting compound is injected through aperture 16 in sleeve 13 into the volume described by the sleeve between the potentiometer casing 10 and the pin base element 17, to fill this volume and form the solid plug 21.

Thus, when completed, as best shown in the sectional view of FIG. 2, the pin base 17 cannot be pulled away from the potentiometer casing 10, since it is cemented to the sleeve and the flange 14 prevents removal of the sleeve in this direction. Similarly, the plug 21 of potting compound prevents the base 17 from being moved toward the potentiometer. As is further apparent, with this solid structure, no lateral play of the base 17 can be had.

In accordance with the present invention, therefore, a conventional solder lug terminal rotary potentiometer has been converted into a rigid plug-in unit, with the projecting ends of pins 18 being adapted to be readily inserted into and removed from a suitable socket therefor.

As is apparent from the foregoing description, by utilization of the teachings of the present invention, a manufacturer need stock only solder lug terminal potentiometers, and as needed, these stock items can be readily converted to plug-in units by means of the present adapter structure.

The foregoing detailed description of one preferred embodiment of the present invention is presented merely by way of example to facilitate a clear understanding of the present invention, and various changes and modifications of the details of this embodiment will be apparent to those skilled in the art. Accordingly, the present invention is not limited to the details of this embodiment, and such changes and modifications as are embraced by the spirit and scope of the appended claims are contemplated as within the purview of the present invention.

What is claimed is:

1. In a potentiometer assembly including a complete potentiometer unit having a potentiometer casing entirely enclosing a resistance element and a variable tap member and mechanically supporting said element and member for relative movement therebetween, and supporting a variable control means extending exteriorly of the casing for effecting said relative movement, and supporting electrical connection terminals also extending exteriorly of said casing; the improvement comprising in combination therewith a plug-in terminal adapter for said potentiometer unit, comprising an adapter casing overlying said potentiometer casing and extending beyond the confines thereof in the area of said terminals forming a housing about and spaced from said terminals, a plurality of plug pins extending through a wall of said adapter casing, projecting to the exterior of said adapter casing and accessible for electrical connection on the interior side of said adapter casing, and being anchored in said wall, means electrically coupling said pins with respective ones of said terminals, the interior of said adapter casing between said wall and said potentiometer casing being substantially filled with a filler material, and means anchoring said adapter casing to said potentiometer casing, whereby said pins projecting exteriorly of said adapter casing provide a plug-in base for the potentiometer assembly.

2. In a potentiometer assembly including a complete potentiometer unit having a potentiometer casing entirely enclosing a resistance element and a variable tap member and mechanically supporting said element and member for relative movement therebetween, and supporting a variable control means extending exteriorly of the casing for effecting said relative movement, and supporting electrical connection terminals also extending exteriorly of said casing; the improvement comprising in combination therewith a plug-in terminal adapter for said potentiometer unit, comprising an adapter casing overlying said potentiometer casing and extending beyond the confines thereof in the area of said terminals forming a housing about and spaced from said terminals, a plurality of plug pins extending through a wall of said adapter casing, projecting to the exterior of said adapter casing and accessible for electrical connection on the interior side of said adapter casing, and being anchored in said wall, means electrically coupling said pins with respective ones of said terminals, and means anchoring said adapter casing to said potentiometer casing comprising an inwardly directed flange on said adapter casing engaging a portion of said potentiometer casing remote from the area of said terminals, whereby said pins projecting exteriorly of said adapter casing provide a plug-in base for the potentiometer assembly.

3. In a potentiometer as set forth in claim 2, said wall being a separate base element, the remainder of said adapter casing being a separate sleeve member, said base element and sleeve member being secured together, and a filler substantially filling the interior of said adapter casing between said base element and said potentiometer housing encasing said terminals and said electrical coupling means.

References Cited in the file of this patent

UNITED STATES PATENTS

| | | |
|---|---|---|
| 2,460,795 | Warrick | Feb. 1, 1949 |
| 2,917,721 | Kelver et al. | Dec. 15, 1959 |
| 2,941,024 | Lamphier | June 14, 1960 |

FOREIGN PATENTS

| | | |
|---|---|---|
| 76,849 | Switzerland | Aug. 14, 1918 |
| 473,402 | Great Britain | Oct. 12, 1937 |